(12) United States Patent
Ady, III et al.

(10) Patent No.: US 9,192,084 B2
(45) Date of Patent: Nov. 17, 2015

(54) ELECTRONIC DEVICES AND ELECTRONIC CIRCUITS AND METHODS FOR MANUFACTURING THE SAME

(71) Applicant: Google Technology Holdings LLC, Mountain View, CA (US)

(72) Inventors: Roger W. Ady, III, Chicago, IL (US); Julio C. Castaneda, Coconut Creek, FL (US)

(73) Assignee: Google Technology Holdings LLC, Mountain View, CA (US)

( * ) Notice: Subject to any disclaimer, the term of this patent is extended or adjusted under 35 U.S.C. 154(b) by 140 days.

(21) Appl. No.: 14/136,118

(22) Filed: Dec. 20, 2013

(65) Prior Publication Data

US 2015/0181772 A1    Jun. 25, 2015

(51) Int. Cl.
  *G06F 1/16*  (2006.01)
  *H05K 9/00*  (2006.01)
  *H05K 7/14*  (2006.01)

(52) U.S. Cl.
  CPC ............ *H05K 9/0022* (2013.01); *H05K 7/1427* (2013.01)

(58) Field of Classification Search
  USPC ......... 174/250, 266, 268, 260, 529, 254, 383, 174/353, 115, 350, 384, 386; 439/607.1, 439/67, 65, 74, 894, 92, 607.07, 460, 439/620.07; 455/456.1, 77, 434, 435.2, 455/575.5, 575.1, 117, 550.1; 713/194; 361/748, 767, 761, 751, 679.01, 361/679.41, 679.39, 679.54, 679.58, 361/679.32, 679.3, 679.02, 679.27, 679.24, 361/679.26, 679.33, 679.48, 679.46, 361/679.37; 248/68.1
  See application file for complete search history.

(56) References Cited

U.S. PATENT DOCUMENTS

| | | | |
|---|---|---|---|
| 5,430,933 A | 7/1995 | Marx et al. | |
| 7,549,064 B2 * | 6/2009 | Elbert et al. | 713/194 |
| 7,719,120 B2 * | 5/2010 | Hiatt et al. | 257/780 |
| 2006/0259788 A1 * | 11/2006 | Elbert et al. | 713/194 |

\* cited by examiner

*Primary Examiner* — Hung Duong
(74) *Attorney, Agent, or Firm* — Faegre Baker Daniels LLP

(57) ABSTRACT

An electronic device (100) includes a device housing (102), a circuit assembly (306) carried by the device housing (102), an electronic component (318) carried by the device housing (102), and a shield (312) carried by the device housing (102). The shield (312) is adapted to impede electromagnetic emissions, and the shield (312) operatively electrically couples the circuit assembly (306) to the electronic component (318).

22 Claims, 14 Drawing Sheets

ELECTRONIC DEVICES AND ELECTRONIC CIRCUITS AND METHODS FOR MANUFACTURING THE SAME

TECHNICAL FIELD

The present disclosure generally relates to electronic devices including circuit assemblies having electromagnetic emission-impeding shields and methods for manufacturing the same. In particular, the present disclosure relates to electronic devices including electromagnetic emission-impeding shields that operatively electrically couple electronic components and methods for manufacturing the same.

BACKGROUND

Some electronic devices, such as cellular telephones, tablet computers, and the like, are relatively thin to achieve one or more design objectives. For example, thin electronic devices are typically considered to be aesthetically appealing. As another example, thin electronic devices are also typically light-weight, and thus relatively easy to carry, compared to other electronic devices. However, thin electronic devices typically lack the structural rigidity needed to protect the circuits and components within. Such electronic circuits are typically fragile and prone to damage, for example, if unintentionally dropped by a device user.

Some electronic devices include "stacked" circuit structures that are relatively durable compared to other circuit structures. Some stacked circuit structures include a first printed circuit board that carries one or more electromagnetic emission-impeding shields or fences. The shields or fences carry a second printed circuit board opposite the first printed circuit board.

DETAILED DESCRIPTION OF EXEMPLARY EMBODIMENTS

Figure 1:
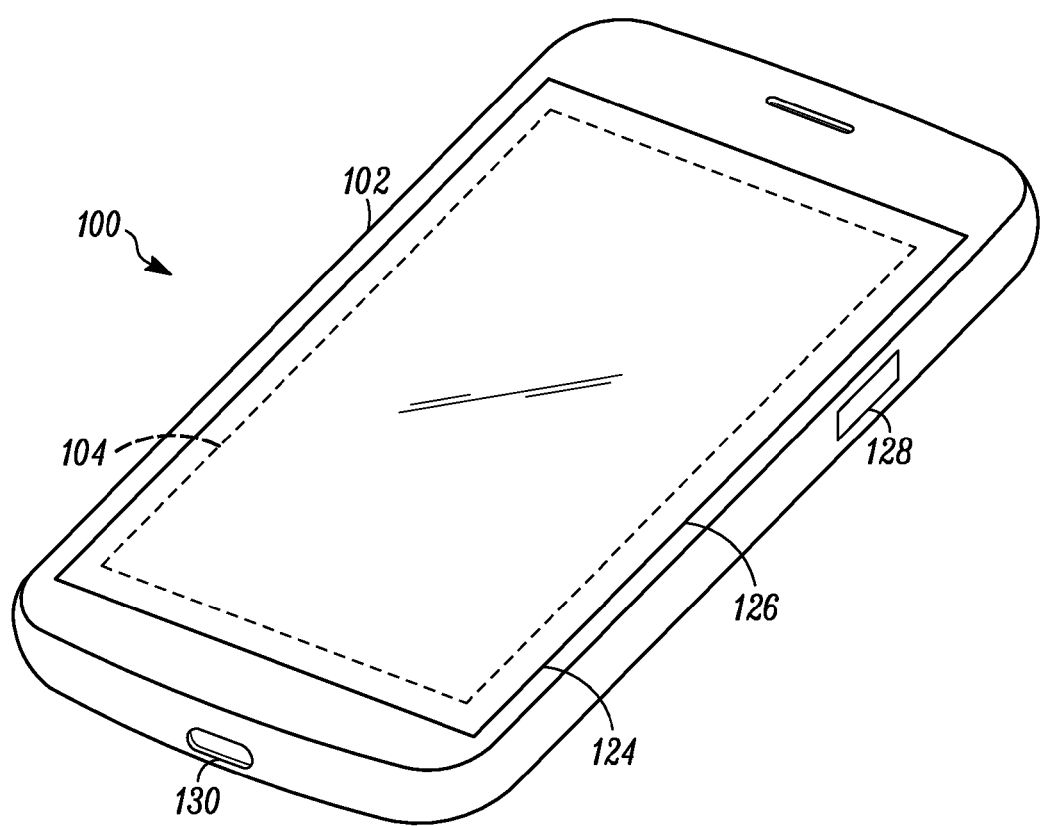
FIG. 1 is a front perspective view of an example electronic device.

Electronic circuits that include stacked structures typically include one or more connector systems (for example, conductive wires or cables or flexible circuit boards with appropriate end terminations) that extend between circuit boards and operatively electrically couple the electronic components carried by the circuit boards. However, such connector systems increase the cost of electronic circuits. In addition, such connectors reduce the reliability of electronic circuits because the connector systems can be damaged or improperly assembled during manufacturing, ultimately affecting the function of the electronic devices incorporating the electronic circuits.

In a specific embodiment, an electronic device comprises a device housing, a circuit assembly carried by the device housing, an electronic component carried by the device housing, and a shield carried by the device housing. The shield is adapted to impede electromagnetic emissions, and the shield operatively electrically couples the circuit assembly to the electronic component.

In some embodiments, the electronic component is a first electronic component, the circuit assembly includes a base and a second electronic component carried by the base, and the shield includes a shield body that defines a shield chamber. The shield chamber houses the second electronic component.

In some embodiments, the shield is a first shield, and the electronic device further comprises a second shield carried by the device housing. The second shield is adapted to impede electromagnetic emissions.

In some embodiments, the second shield operatively electrically couples the circuit assembly to the electronic component.

In some embodiments, the electronic component is one of a battery, a short range communication component, a wireless charging component, an illumination component, a radio component, an electrostatic discharge grounding component, a user identification and/or authentication component, and a user input component.

In a specific embodiment, an electronic device comprises a circuit assembly and a shield carried by the circuit assembly. The shield is adapted to impede electromagnetic emissions. An electronic component is carried by the shield, and the shield operatively electrically couples the circuit assembly to the electronic component.

In some embodiments, the electronic component is a first electronic component, the circuit assembly includes a base and a second electronic component carried by the base, and the shield includes a shield body that defines a shield chamber. The shield chamber houses the second electronic component.

In some embodiments, the electronic device further comprises a connection securing the shield to the circuit assembly and operatively electrically coupling the circuit assembly to the electronic component via the shield.

In some embodiments, the connection is a solder connection.

In some embodiments, the solder connection is a first solder connection, and the electronic device further comprises a second solder connection securing the shield to the electronic component and operatively electrically coupling the circuit assembly to the electronic component via the shield.

In some embodiments, the electronic component is a first electronic component, the circuit assembly includes a base, a second electronic component carried by the base, and a third electronic component carried by the base. The electronic device further comprises a first connection electrically coupling the shield to the second electronic component and a second connection electrically coupling the shield to the third electronic component.

In some embodiments, the first connection and the second connection are solder connections.

In some embodiments, the electronic component is a battery, and the battery transmits power to the second electronic component via the shield and the first connection, and the battery transmits power to the third electronic component via the shield and the second connection.

In some embodiments, the shield is interposed between the circuit assembly and the electronic component.

In some embodiments, the circuit assembly is a first circuit assembly, and the electronic device further comprises a second circuit assembly including a base carrying the electronic component, and the shield operatively electrically couples the first circuit assembly to the electronic component via the base.

In some embodiments, the shield is interposed between the first circuit assembly and the second circuit assembly.

In some embodiments, the circuit assembly is a first circuit assembly and the shield is a first shield. The electronic device further comprises a second circuit assembly including a base carrying the electronic component and a second shield carried by the first circuit assembly. The second shield is adapted to impede electromagnetic emissions. The first shield and the second shield operatively electrically couple the first circuit assembly to the electronic component via the base.

In some embodiments, the electronic component is a battery including a positive terminal and a negative terminal, and the first shield operatively electrically couples the positive terminal to the first circuit assembly and the second shield operatively electrically couples the negative terminal to the first circuit assembly.

In some embodiments, the shield is a first shield, and the electronic device further comprises a second shield carried by the circuit assembly. The second shield operatively electrically couples the circuit assembly to the electronic component.

In a specific embodiment, a method for manufacturing an electronic device comprises providing a device housing, a circuit assembly, an electronic component, and a shield adapted to impede electromagnetic emissions; electrically coupling the shield to the circuit assembly; electrically coupling the shield to the electronic component to operatively electrically couple the circuit assembly to the electronic component; and coupling the circuit assembly, the electronic component, and the shield to the device housing.

In some embodiments, the circuit assembly is a first circuit assembly, and the method further comprises providing a second circuit assembly including a base carrying the electronic component, and electrically coupling the shield to the electronic component includes electrically coupling the shield to the base.

In some embodiments, electrically coupling the shield to the first circuit assembly includes soldering the shield to the first circuit assembly, and electrically coupling the shield to the base includes soldering the shield to the base.

As used herein, the term "shield" may refer to, for example, five-sided enclosures that electrically and/or magnetically isolate groups of electronic components or four-sided components (sometimes referred to as "fences") that electrically and/or magnetically isolate groups of electronic components when coupled to a cover.

Figure 2:
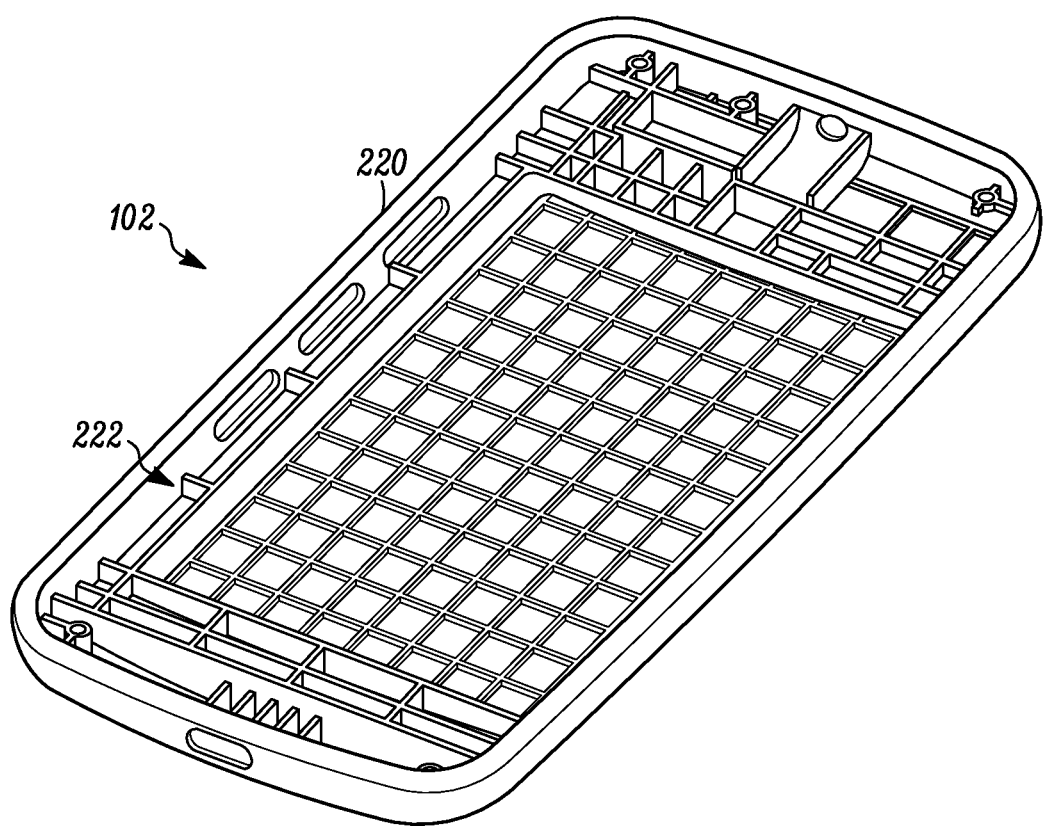
FIG. 2 is a perspective view of a device housing of the electronic device of FIG. 1.
Figure 3:
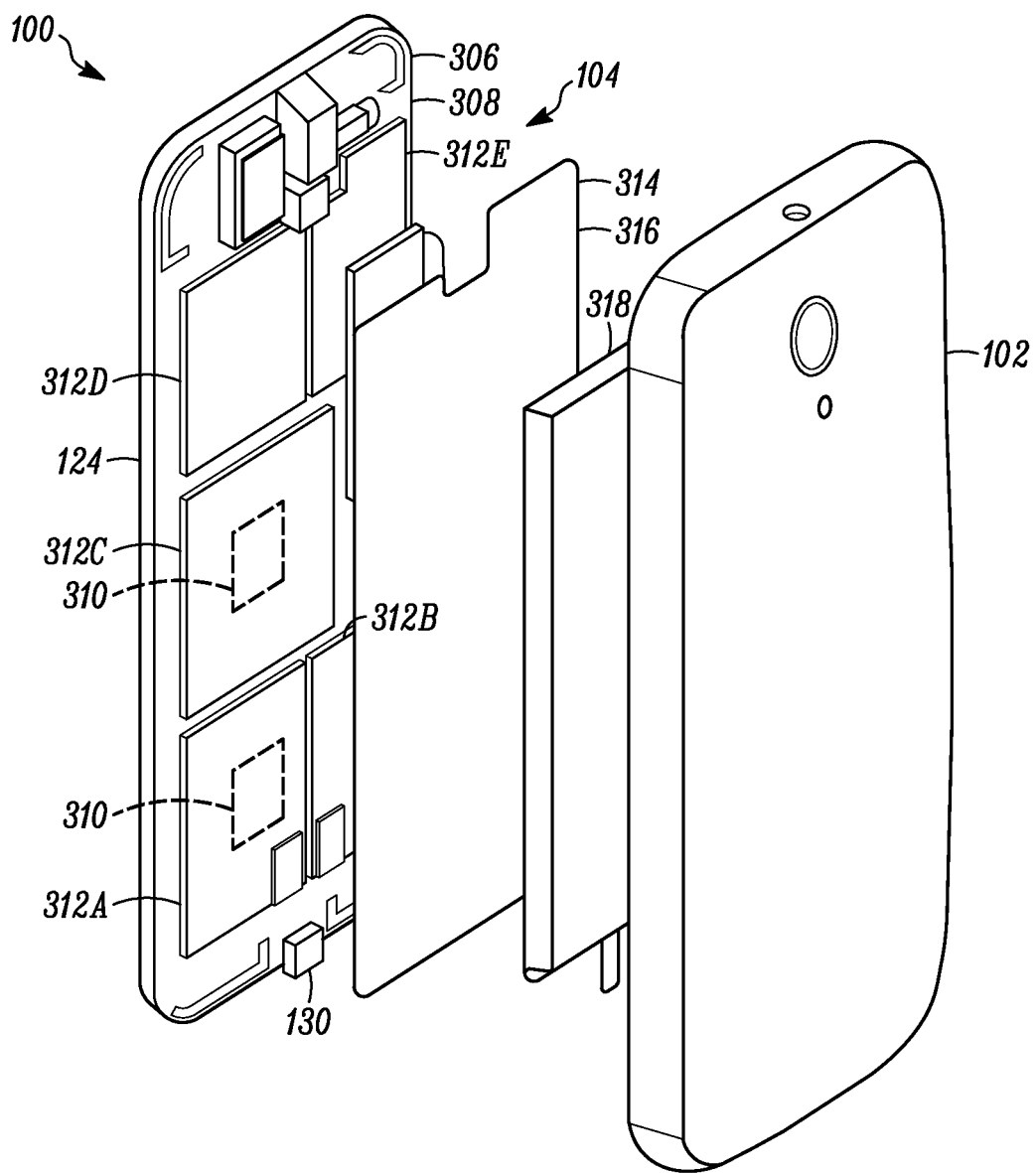
FIG. 3 is an exploded rear perspective view of the electronic device of FIG. 1.

Turning now to the drawings, an exemplary electronic device 100 according to the present disclosure is illustrated in FIGS. 1-3. The electronic device 100 generally includes a device housing 102 that carries electronic circuitry 104. The electronic circuitry 104 includes a first circuit assembly 306 (for example, a first base or printed circuit board 308 carrying one or more electronic components 310, such as a processor, a memory device, a communication bus, a thermistor, a battery safety circuit, and the like). The device housing 102 also carries one or more shields 312 that are adapted to impede electromagnetic emissions therethrough. One or more of the shields 312 operatively electrically couple the first circuit assembly 306 to a second circuit assembly 314 (for example, a second base or printed circuit board 316 carrying one or more electronic components, such as a battery 318). The first circuit assembly 306 and the second circuit assembly 314 may transmit electrical power and/or electrical communication/data signals to each other via the shields 312 (for example, the second circuit assembly 314 may transmit power from the battery 318 to one or more of the electronic components 310 of the first circuit assembly 306 via the shields 312). In some embodiments, the first circuit assembly 306, the shields 312, and the second circuit assembly 314 form a "stacked" structure that is relatively stiff compared to other electronic circuits. In some embodiments, operatively electrically coupling the first circuit assembly 306 to the second circuit assembly 314 via one or more of the shields 312 permits the electronic circuitry 104 to include relatively few, or even completely omit, traditional electrical connectors (for example, conductive wires or cables) that operatively electrically couple the circuit assemblies 306 and 314. The aspects are explained in further detail below.

The electronic device 100 may be any of various types of devices capable of receiving and/or transmitting electrical power and/or electrical communication/data signals, such as a cellular telephone (as illustrated in the figures), a tablet computer, a notebook computer, a personal digital assistant (PDA), a flat-screen television, a flat-screen computer monitor, a digital media player, a digital camera, a peripheral device (such as a printer, a scanner, a web camera), or the like. The electronic circuitry 104 facilitates performing actions via the electronic device 100 (for example, placing phone calls, browsing the Internet, taking digital photographs, and the like).

The device housing 102 may be a unitary or monolithic structure, or the housing 102 may include two or more components that are coupled to each other (for example, via fasteners). The device housing 102 may include any of various materials (for example, one or more polymers or the like). In some embodiments, the device housing 102 includes a frame 220 that defines a housing chamber 222. The housing chamber 222 houses the electronic circuitry 104.

In some embodiments, the device housing 102 carries a display 124 that is operatively electrically coupled to the electronic circuitry 104. The display 124 receives electronic signals from the electronic circuitry 104 to provide visual information to a device user. The display 124 may generally be any of various types of displays, such as an organic light-emitting diode (OLED) display, a liquid crystal display (LCD), or the like. In some embodiments, the display 124 includes a display panel (not shown; for example, an OLED panel, an LCD panel, or the like) that provides visual information to the device user, a polarizing panel or filter (not shown), and a transparent lens 126. In some embodiments, the display 124 includes a touch and/or gesture sensor (not shown; for example, a capacitive or resistive sensor) that transmits electronic signals to the electronic circuitry 104 upon receiving touch and/or gesture inputs from the device user.

In some embodiments, the device housing 102 mounts one or more user input keys or buttons 128 that are operatively electrically coupled to the electronic circuitry 104. The buttons 128 transmit electronic signals to the electronic circuitry 104 upon receiving touch and/or gesture inputs from the device user. In some embodiments, the buttons 128 may include a power button, an audio volume button, or the like.

In some embodiments, the device housing 102 mounts one or more power and/or data ports 130 that are operatively electrically coupled to the electronic circuitry 104. In some embodiments, one or more of the ports 130 may be a micro Universal Serial Bus (USB) port, a mini USB port, a High-Definition Multimedia Interface (HDMI) port, a 3.5mm audio port, or the like.

Figure 4:
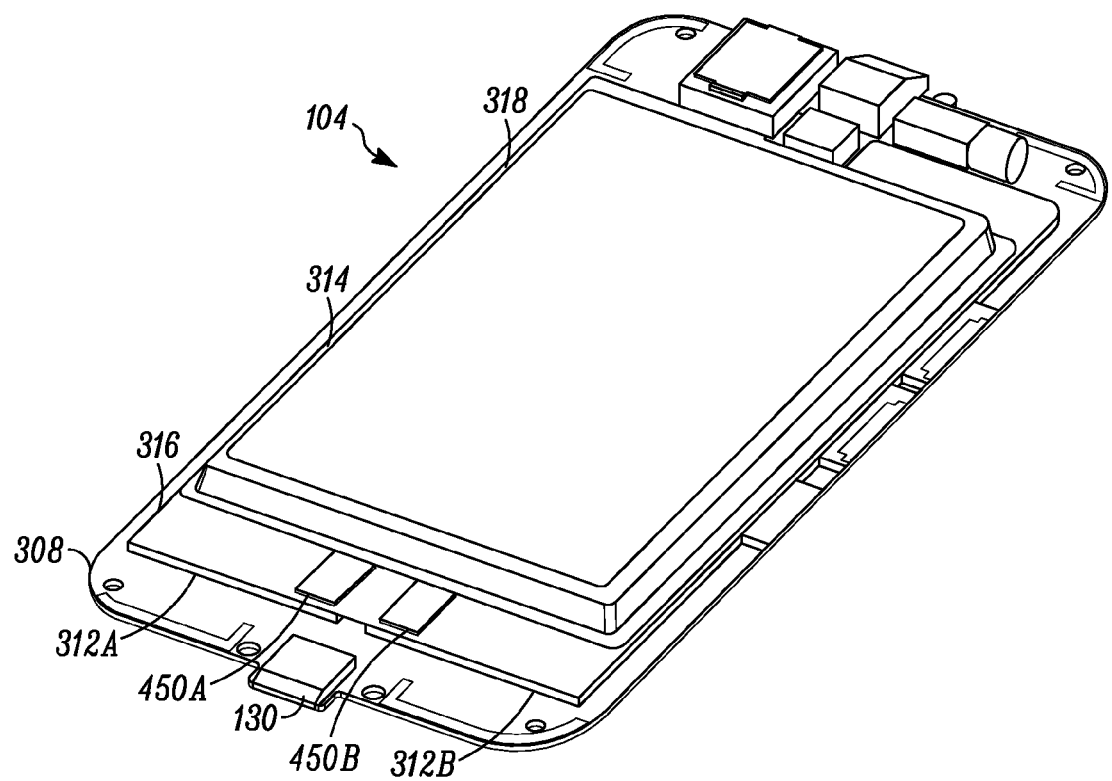
FIG. 4 is a rear perspective view of electronic circuitry of the electronic device of FIG. 1.
Figure 6:
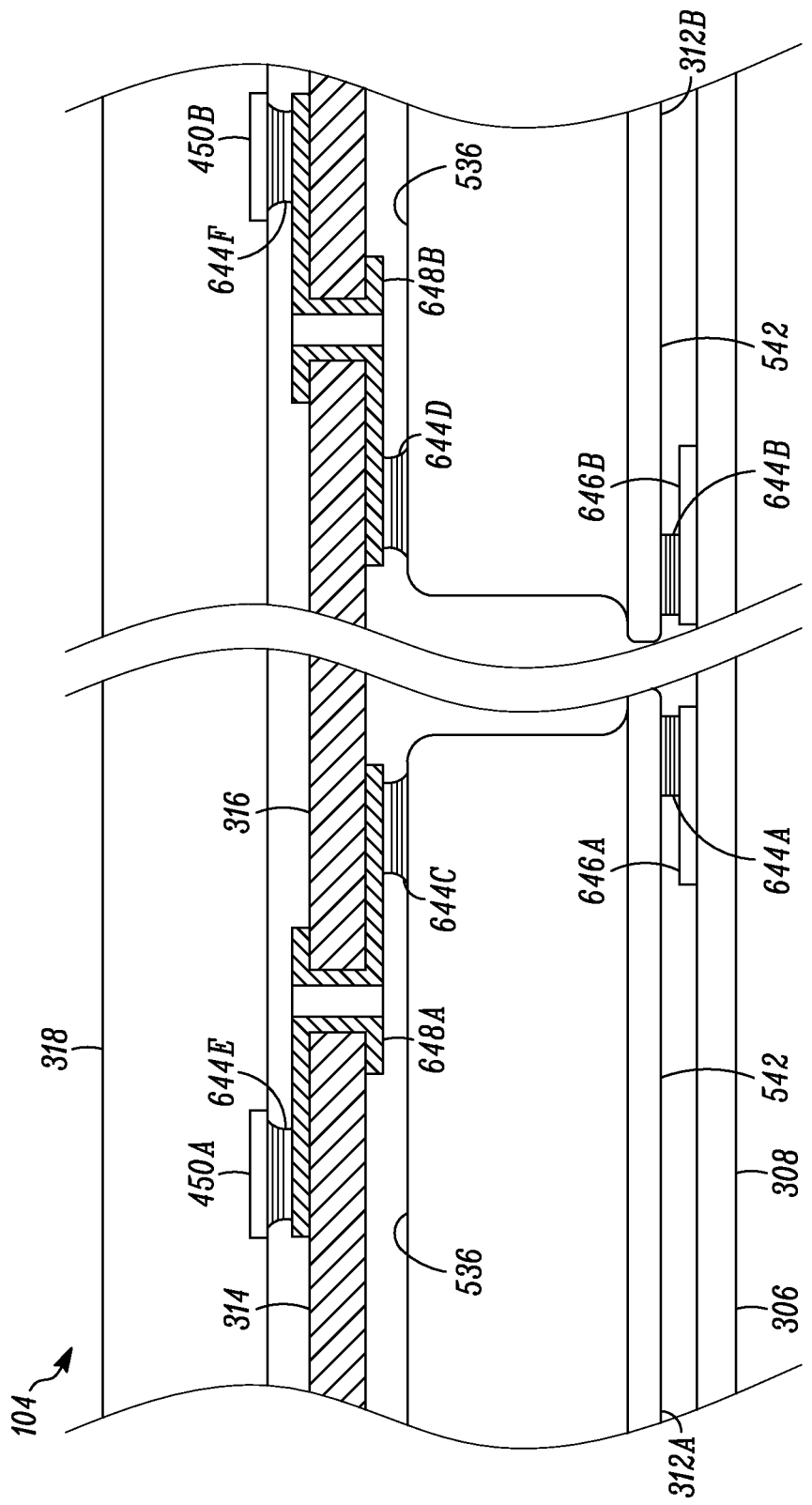
FIG. 6 is a partial side sectional view of the electronic circuitry of FIG. 4.

Referring now to FIGS. 3, 4, and 6, in some embodiments, the first base or printed circuit board 308 of the first circuit assembly 306 includes various layers, such as a substrate layer (for example, a fiberglass layer), one or more conductive layers (for example, copper layers) that form conductive paths or traces and solder pads or rings, one or more insulating layers (sometimes referred to as "solder mask" or "solder stop" layers) overlying the traces and leaving the solder pads exposed, and the like. In some embodiments, the substrate layer may include through holes that house conductive elements or "vias" that electrically couple traces and/or solder pads disposed on opposite sides of the first printed circuit board 308.

In some embodiments, the first printed circuit board 308 carries one or more electronic components 310, such as a processor, a memory device, a communication bus, and the like. One or more of the electronic components 310 may be carried on a first side of the first printed circuit board 308 (that is, a side proximate the display 124), and one or more of the electronic components 310 may be carried on a second side of the first printed circuit board 308 (that is, a side opposite the first side). In some embodiments, the first printed circuit board 308 carries one or more of the power and/or data ports 130. One or more of the power and/or data ports 130 may be carried on the first side of the first printed circuit board 308, and one or more of the power and/or data ports 130 may be carried on the second side of the first printed circuit board 308. The first printed circuit board 308 may operatively electrically couple (that is, facilitate transmission of electrical power and/or electrical communication/data signals between) one or more of the electronic components 310 and/or one or more of the power and/or data ports 130 using the traces, solder pads, and vias.

In some embodiments, the first circuit assembly 306 carries one or more of the shields 312 on the second side of the first printed circuit board 308. The shields 312 impede electromagnetic emissions therethrough. That is, each shield 312 inhibits electromagnetic interference between electronic components housed within the shield 312 and electronic components disposed outside of the shield 312. Each shield 312 may house, for example, one or more of the electronic components 310 described above, such as the processor, the memory device, the communication bus, or the like.

Figure 5:
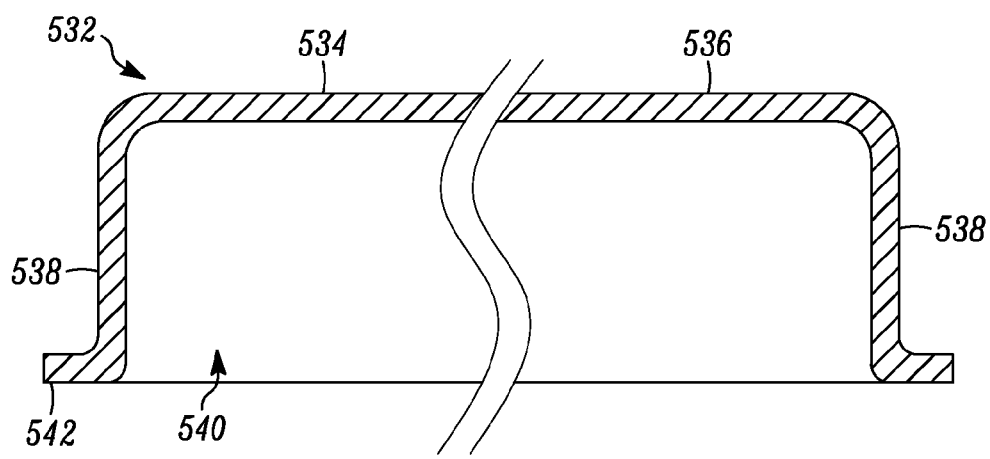
FIG. 5 is a side sectional view of a shield of the electronic circuitry of FIG. 4.

The electronic device 100 may include various numbers, sizes, and/or arrangements of shields 312. For example and as shown in FIGS. 3-5, the electronic device 100 may include a first shield 312A, a second shield 312B, a third shield 312C, a fourth shield 312D, and a fifth shield 312E, some of which have different length and width dimensions. Some of the edges of the shields 312 may be generally parallel and offset from each other to impart stiffness to the electronic circuitry 104 (see, for example, the first shield 312A, the third shield 312C, and the fourth shield 312D). Other arrangements, numbers, and sizes of the shields 312 are described in further detail below.

Referring briefly to FIG. 5, in some embodiments each of the shields 312 generally includes a structure similar to that of a generic shield 532. The shield 532 may include one or more conductive materials, such as copper or tin. The shield 532 includes a shield body 534 (sometimes referred to as a "can") that in turn includes an end wall 536 and a plurality of side walls 538. The walls 536 and 538 define a shield chamber 540 that houses one or more of the electronic components. The shield body 534 also includes a lip or flange 542 that facilitates securing and electrically coupling the shield 532 to the first circuit assembly 306 (for example, coupling the flange 542 to the first printed circuit board 308 via one or more solder connections). Other general structures for the shields 312 are described in further detail below.

Referring again to FIGS. 3, 4, and 6, and particularly FIG. 6, one or more of the shields 312 may be secured and electrically coupled to the first circuit assembly 306. For example, the first shield 312A may be secured and electrically coupled to the first printed circuit board 308 via a first solder connection 644A. Specifically, the first solder connection 644A may secure and electrically couple the flange 542 of the first shield 312A to a first solder pad 646A of the first printed circuit board 308 (for example, the first shield 312A may be "hot barred" to the first printed circuit board 308; that is, the first shield 312A and/or the first printed circuit board 308 may be pre-coated with solder material, and the components may be secured and electrically coupled to each other upon application of sufficient heat and pressure to the solder material). The first solder pad 646A may electrically couple to one or more of the electronic components 310 via one or more traces of the first printed circuit board 308. Thus, the first printed circuit board 308 and the first solder connection 644A electrically couple the first shield 312A to one or more of the electronic components 310.

As another example, the second shield 312B may be secured and electrically coupled to the first printed circuit board 308 via a second solder connection 644B. Specifically, the second solder connection 644B may secure and electrically couple the flange 542 of the second shield 312B to a second solder pad 646B of the first printed circuit board 308 (for example, the second shield 312B may be hot barred to the first printed circuit board 308). The second solder pad 646B may electrically couple to one or more of the electronic components 310 via one or more traces of the first printed circuit board 308. Thus, the first printed circuit board 308 and the second solder connection 644B electrically couple the second shield 312B to one or more of the electronic components 310.

In some embodiments, one or more of the shields 312 may be secured to the first circuit assembly 306 and electrically isolated from the electronic components 310. For example, the third shield 312C, the fourth shield 312D, and the fifth shield 312E may be secured to the first printed circuit board 308 and electrically isolated from the electronic components 310. Specifically, the third shield 312C, the fourth shield 312D, and the fifth shield 312E may each be secured to the first printed circuit board 308 by a solder connection (not shown) that is disposed apart from the solder pads of the first printed circuit board 308.

Still referring to FIGS. 3, 4, and 6, the second circuit assembly 314 includes the second base or printed circuit board 316. In some embodiments, the second printed circuit board 316 is positioned on a side from the shields 312 opposite the first circuit assembly 306 (that is, the shields 312 may be interposed or "sandwiched" between the first circuit assembly 306 and the second circuit assembly 314).

In some embodiments the second base or printed circuit board 316 includes various layers, such as a substrate layer (for example, a fiberglass layer), one or more conductive layers (for example, copper layers) that form conductive paths or traces and solder pads or rings, one or more insulating layers (that is, solder mask or solder stop layers) overlying the traces and leaving the solder pads exposed, and the like. In some embodiments, the substrate layer may include through holes that house conductive elements or vias that electrically couple traces and/or solder pads disposed on opposite sides of the second printed circuit board 316.

One or more of the shields 312 may be secured and electrically coupled to the second circuit assembly 314. For example, the first shield 312A may be secured and electrically coupled to the second printed circuit board 316 via a third solder connection 644C. Specifically, the third solder connection 644C may secure and electrically couple one of the walls of the first shield 312A, such as the end wall 536, to a first solder pad and via 648A of the second printed circuit board 316 (for example, the first shield 312A may be hot barred to the second printed circuit board 316). As another example, the second shield 312B may be secured and electrically coupled to the second printed circuit board 316. For example, the second shield 312B may be secured and electrically coupled to the second printed circuit board 316 via a fourth solder connection 644D. Specifically, the fourth solder connection 644D may secure and electrically couple one of the walls of the second shield 312B, such as the end wall 536, to a second solder pad and via 648B of the second printed circuit board 316 (for example, the second shield 312B may be hot barred to the second printed circuit board 316).

In some embodiments, one or more of the shields 312 may be secured to the second circuit assembly 314 and electrically isolated from the electronic components of the second circuit assembly 314 (for example, the battery 318). For example, the third shield 312C, the fourth shield 312D, and the fifth shield 312E may be secured to the second printed circuit board 316 and electrically isolated from the electronic components of the second circuit assembly 314. Specifically, the third shield 312C, the fourth shield 312D, and the fifth shield 312E may each be secured to the second printed circuit board 316 by a solder connection (not shown) that is disposed apart from the solder pads of the second printed circuit board 316.

As described above, the second printed circuit board 316 carries one or more electronic components, such as a battery 318. One or more of the electronic components may be carried on a first side of the second printed circuit board 316 (that is, a side proximate the shields 312), and one or more of the electronic components may be carried on a second side of the second printed circuit board 316 (that is, a side opposite the first side). In some embodiments, the battery 318 is carried on the second side of the second printed circuit board 316.

The battery 318 may generally be any of various types of batteries and may have any of various storage capacities. For example, the battery 318 may have a storage capacity of 2000 mAh. The battery 318 may be adhered to the second printed circuit board 316.

In some embodiments, the battery 318 is secured and electrically coupled to the second printed circuit board 316. For example, the battery 318 may be secured and electrically coupled to the second printed circuit board 316 via a fifth solder connection 644E. Specifically, the fifth solder connection 644E may secure and electrically couple a first or positive terminal 450A of the battery 318 to the first solder pad and via 648A of the second printed circuit board 316 (for example, the first terminal 450A may be hot barred to the second printed circuit board 316). As another example, the battery 318 may be secured and electrically coupled to the second printed circuit board 316 via a sixth solder connection 644F. Specifically, the sixth solder connection 644F may secure and electrically couple a second or negative terminal 450B of the battery 318 to the second solder pad and via 648B of the second printed circuit board 316 (for example, the second terminal 450B may be hot barred to the second printed circuit board 316).

Thus, one or more of the shields 312 operatively electrically couple the first circuit assembly 306 to the second circuit assembly 314. Specifically, in some embodiments, the second circuit assembly 314 transmits power from the battery 318 to one or more of the electronic components 310 of the first circuit assembly 306 via the shields 312.

In some embodiments, the second circuit assembly 314 may first transmit electrical power and/or electrical communication/data signals to one of the electronic components 310 of the first circuit assembly 306 via the shields 312, and the electrical component 310 may then route power and/or electrical communication/data signals to one or more of the other electronic components 310. For example, the second circuit assembly 314 may transmit power from the battery 318 to an electronic component 310 adapted to store power, such as a capacitor, via the shields 312. The capacitor may then route power to one or more of the other electronic components 310.

Figure 7:
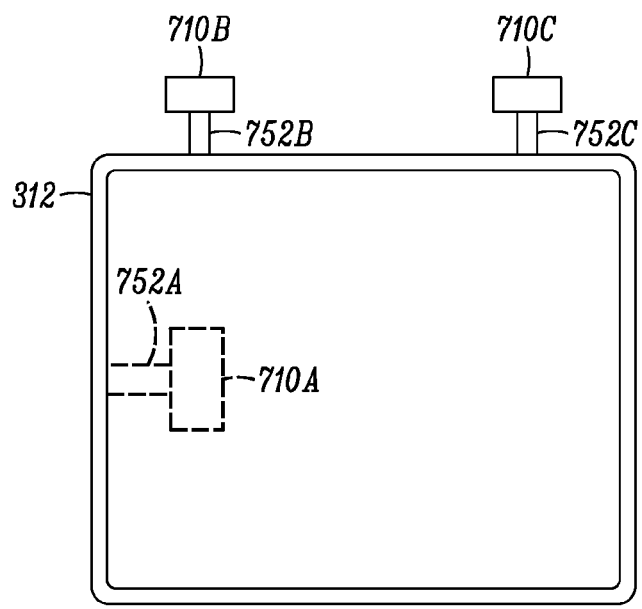
FIG. 7 is a top view of a shield acting as "bus bar" to provide power to various electronic components.

Referring now to FIG. 7, in some embodiments one or more of the shields 312 may electrically couple to the battery 318, and one or more of the shields 312 may act as "bus bars" to provide power to various electronic components 310 disposed within or outside of the shields 312. That is, various electronic components 310 may be separately electrically coupled to a shield 312 to receive power therefrom. For example, a first electronic component 710A disposed within a shield 312 may electrically couple to the shield 312 via a first solder connection 752A, a second electronic component 710B disposed outside of the shield 312 may electrically couple to the shield 312 via a second solder connection 752B, and a third electronic component 710C disposed outside of the shield 312 may electrically couple to the shield 312 via a third solder connection 752C. The shield 312 may electrically couple to a first or positive terminal of the battery 318. Each electronic component 710A, 710B, and 710C may electrically couple to a second or negative terminal of the battery 318 in various manners. For example, each electronic component 710A, 710B, and 710C may be separately electrically coupled to the negative terminal of the battery 318 (for example, via separate solder connections; not shown). As another example, each electronic component 710A, 710B, and 710C may electrically couple to a second shield (not shown) that acts as a negative bus bar.

Figure 8:
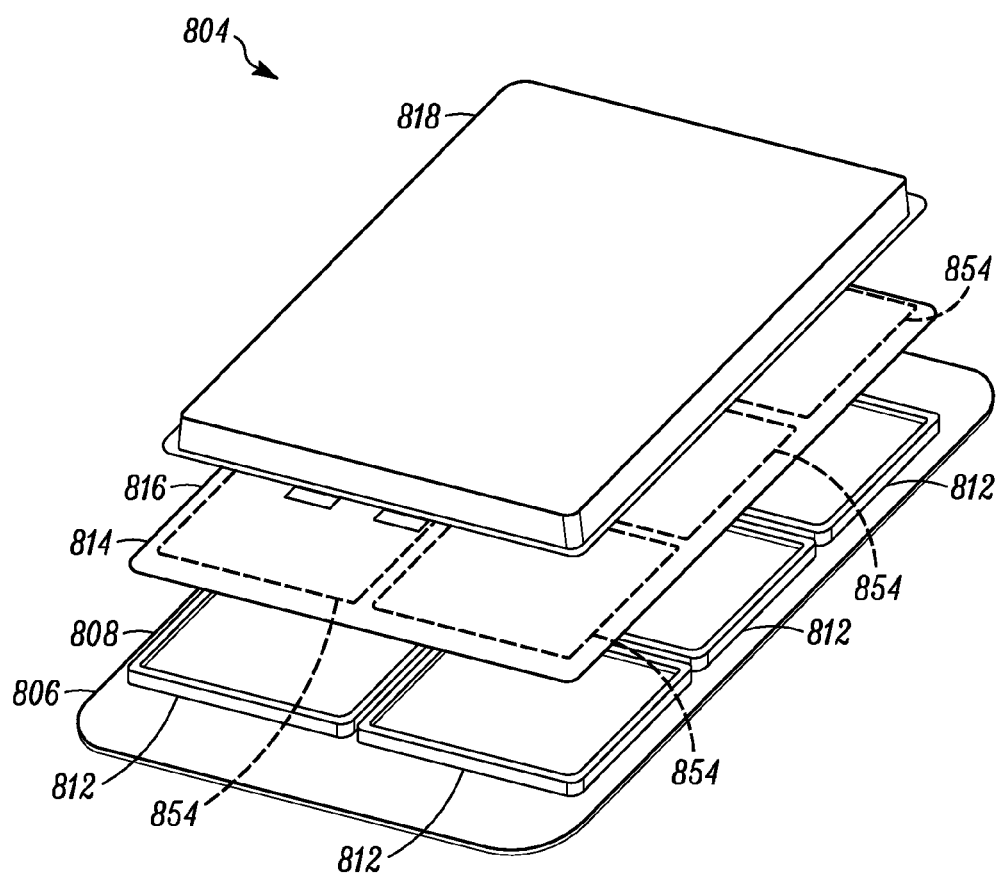
FIG. 8 is an exploded rear perspective view of example electronic circuitry for an electronic device.
Figure 9:
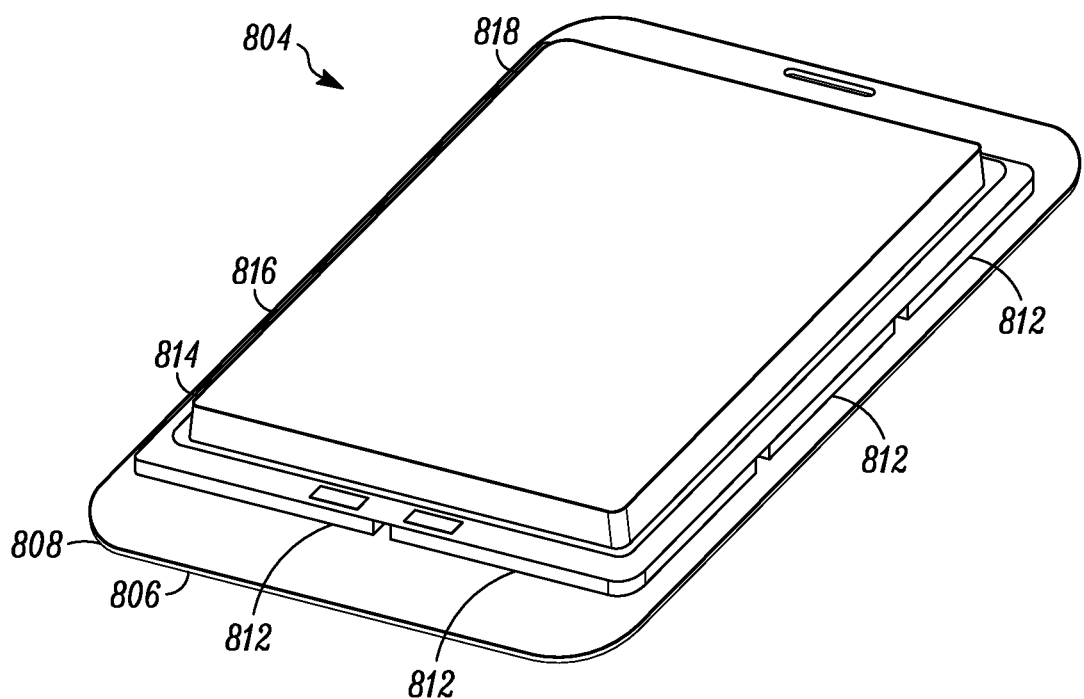
FIG. 9 is a rear perspective view of the electronic circuitry of FIG. 8.
Figure 10:
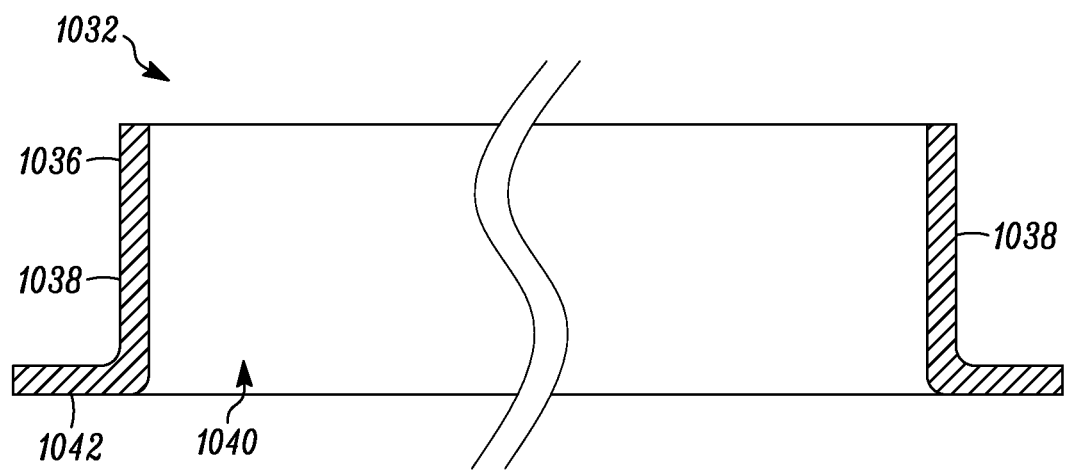
FIG. 10 is a side sectional view of a shield of the electronic circuitry of FIG. 8.

Referring to FIGS. 8-10, another exemplary embodiment of electronic circuitry 804 for an electronic device according to the present disclosure is illustrated. The electronic circuitry 804 is similar to the electronic circuitry 104 described above. That is, the electronic circuitry 804 includes a first circuit assembly 806 that in turn includes a first base or printed circuit board 808. The first printed circuit board 808 carries one or more electronic components (not shown), such as a processor, a memory device, a communication bus, and the like. The first printed circuit board 808 carries one or more frames or "fences" 812 that each house one or more of the electronic components and impede electromagnetic emissions therethrough. One or more of the frames 812 electrically couple to one or more of the electronic components (for example, via solder connections, solder pads, and traces of the first printed circuit board 808).

Each of the frames 812 generally includes a structure similar to that of a generic frame 1032 (see FIG. 10). The frame 1032 may include one or more conductive materials, such as copper or tin. The frame 1032 includes a frame body 1036 that in turn includes a plurality of side walls 1038. The walls 1038 define, in part, a chamber 1040 that houses one or more of the electronic components. The frame body 1036 also includes a lip or flange 1042 that facilitates securing and electrically coupling the frame 1032 to the first circuit assembly 306 (for example, coupling the flange 1042 to the first printed circuit board 808 via one or more solder connections). In contrast to the shield 532 described above, however, the frame 1032 lacks an end wall. As such, the chamber 1040 defines a hole that extends through the frame 1032.

The frames 812 carry a second circuit assembly 814 opposite the first circuit assembly 806. The second circuit assembly 814 includes a second base or printed circuit board 816. A first side of the second printed circuit board 816 (that is, the side proximate the frames 812) includes one panel 854 for each frame 812. Each panel 854 may be secured and electrically coupled to the associated frame 812 (for example, via a solder connection; not shown) to define a wall of the chamber 1040 opposite the flange 1042. Each panel 854 may include one or more conductive materials, such as copper, and impedes electromagnetic emissions therethrough. As such, each panel 854 and the associated frame 812 together define a shield that impedes electromagnetic emissions therethrough. In addition, each panel 854 may electrically couple the associated frame 812 to the second printed circuit board 816.

One or more of the panels 854 may electrically couple to one or more electronic components carried by the second printed circuit board 816 (for example, a battery 818) via solder pads, traces, and/or vias (not shown) of the second printed circuit board 816. Thus, one or more of the frames 812 and associated panels 854 (that is, one or more of the shields) operatively electrically couple the first circuit assembly 806 to the second circuit assembly 814. Specifically, in some embodiments, the second circuit assembly 814 transmits power from the battery 818 to one or more of the electronic components of the first circuit assembly 806 via the frames 812 and associated panels 854.

Figure 11:
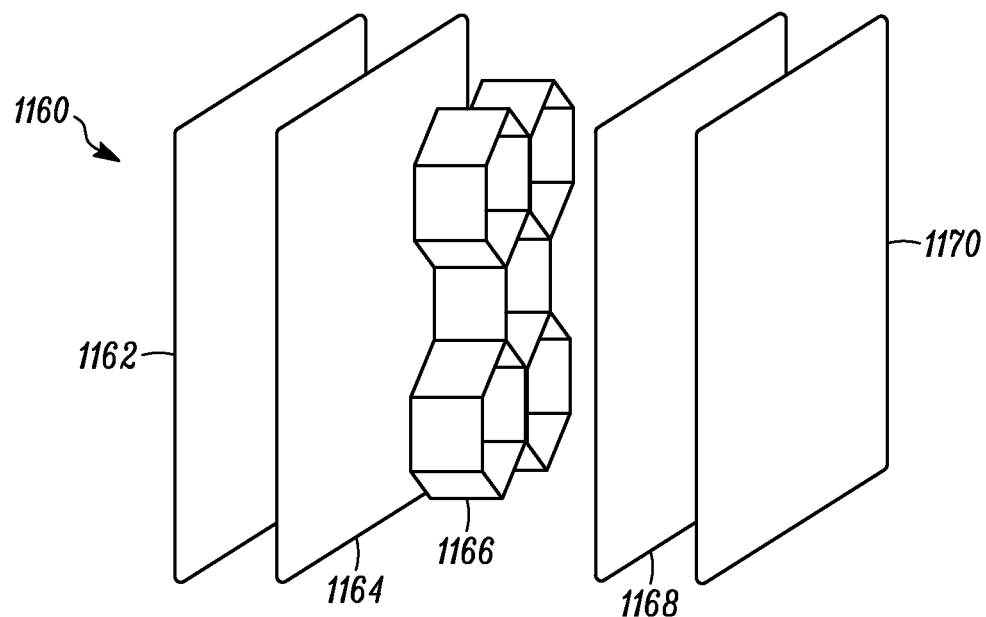
FIG. 11 is an exploded rear perspective view of an example circuit assembly for an electronic device.

Referring to FIG. 11, an exemplary embodiment of a circuit assembly 1160 for an electronic device according to the present disclosure is illustrated. The circuit assembly 1160 may provide a suitable structure for any of the circuit assemblies described herein (for example, the circuit assemblies 306, 314, 806, and 814). The circuit assembly 1160 includes a first base or printed circuit board 1162 that carries one or more electronic components (not shown), such as a processor, a memory device, a communication bus, a thermistor, a battery safety circuit, and the like. One side of the first printed circuit board 1162 carries a first adhesive 1164. Opposite the first printed circuit board 1162, the first adhesive 1164 couples to a shield assembly 1166. The shield assembly 1166 houses one or more of the electronic components and impedes electromagnetic emissions therethrough. In some embodiments, the shield assembly 1166 may have a "honey-comb" structure. That is, each shield may have six side walls that define a hexagonal shape, and some of the side walls may be shared by adjacent shields. Opposite the first adhesive 1164, the shield assembly 1166 couples to a second adhesive 1168. Opposite the shield assembly 1166, the second adhesive 1168 couples to a second base or printed circuit board 1170. The second printed circuit board 1170 carries one or more electronic components (not shown), such as a processor, a memory device, a communication bus, a thermistor, a battery safety circuit, and the like. The electronic components may be electrically coupled to another circuit assembly via additional shields (not shown), such as the shields described above.

Figure 12:
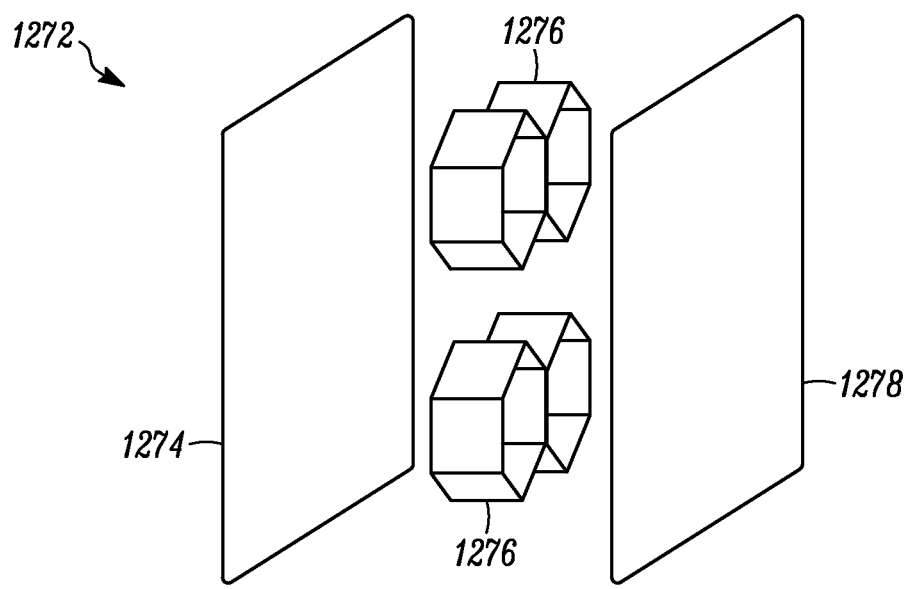
FIG. 12 is an exploded rear perspective view of example electronic circuitry for an electronic device.

Referring to FIG. 12, an exemplary embodiment of electronic circuitry 1272 for an electronic device according to the present disclosure is illustrated. The electronic circuitry 1272 includes a first base or printed circuit board 1274. The first printed circuit board 1274 carries one or more electronic components (not shown), such as a processor, a memory device, a communication bus, and the like. The first printed circuit board 1274 carries one or more shield assemblies 1276 that each house one or more of the electronic components and impede electromagnetic emissions therethrough. In some embodiments, each shield assembly 1276 includes a honeycomb structure. That is, in each shield assembly 1276 each shield may have six side walls that define a hexagonal shape, and some of the side walls may be shared by adjacent shields. In some embodiments, each shield includes an end wall (not shown) to define a shield chamber together with the side walls. In some embodiments, a second base or printed circuit board 1278 includes a plurality of panels (not shown) to define a plurality of shield chambers together with the side walls of the shield assembly 1276. Opposite the first printed circuit board 1274, the shield assemblies 1276 couple to the second printed circuit board 1278. The second printed circuit board 1278 carries one or more electronic components (not shown), such as a battery. One or more of the shield assemblies 1276 operatively electrically couple one or more of the electronic components carried by the first printed circuit board 1274 to one or more of the electronic components carried by the second printed circuit board 1278 (for example, via solder connections, solder pads, and traces of the printed circuit boards 1274 and 1278; not shown).

Figure 13:
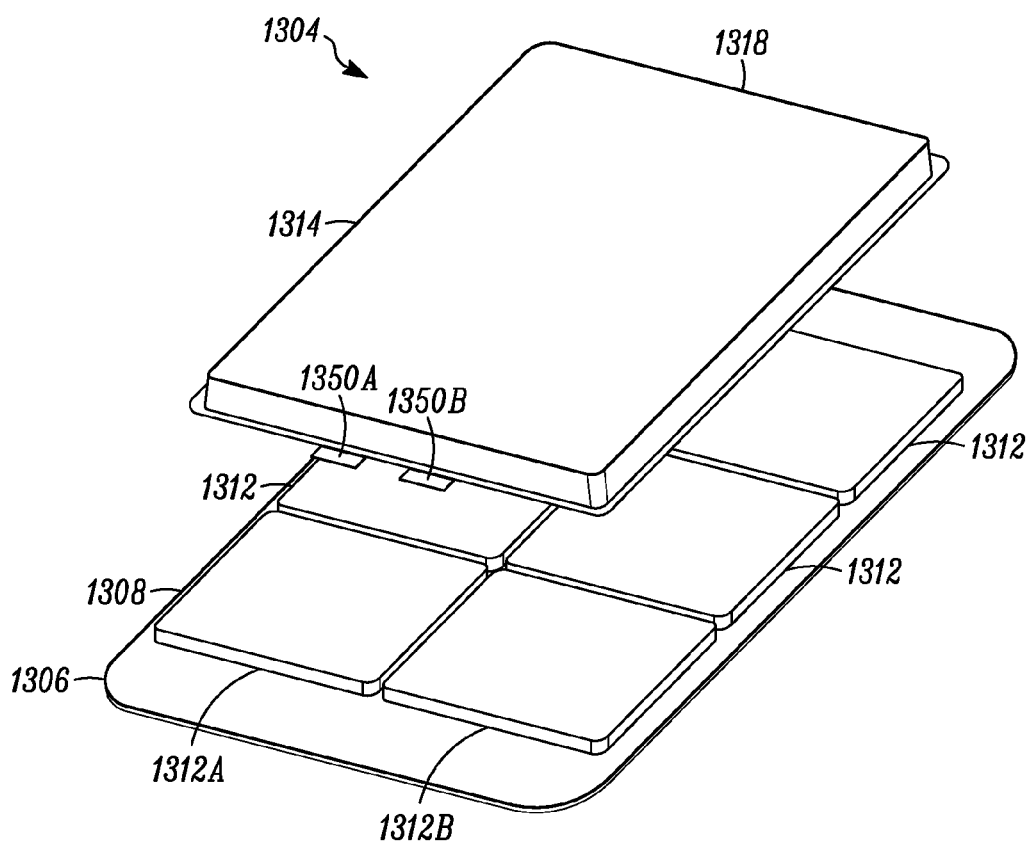
FIG. 13 is an exploded rear perspective view of example electronic circuitry for an electronic device.

Referring to FIG. 13, another exemplary embodiment of electronic circuitry 1304 for an electronic device according to the present disclosure is illustrated. The electronic circuitry 1304 is similar to the electronic circuitry 104 described above. That is, the electronic circuitry 1304 includes a first circuit assembly 1306 that in turn includes a first base or printed circuit board 1308. The first printed circuit board 1308 carries one or more electronic components (not shown), such as a processor, a memory device, a communication bus, and the like. The first printed circuit board 1308 carries one or more shields 1312 that each house one or more of the electronic components and impede electromagnetic emissions therethrough. One or more of the shields 1312 electrically couple to one or more of the electronic components (for example, via solder connections, solder pads, and traces of the first printed circuit board 1308). In some embodiments, each of the shields 1312 generally includes a structure similar to that of the generic shield 532 described above.

The shields 1312 carry a second circuit assembly 1314 opposite the first circuit assembly 1306. Unlike the embodiments described above, the second circuit assembly 1314 lacks a base or printed circuit board. Instead, one or more of the shields 1312 are secured to one or more electronic components, such as a battery 1318, for example, via one or more adhesives. One or more of the shields 1312 may be secured and electrically coupled to one or more electronic components. For example, a first shield 1312A may be secured and electrically coupled to a first or positive terminal 1350A of the battery 1318 via a solder connection (not shown). As another example, a second shield 1312B may be secured and electrically coupled to a second or negative terminal 1350B of the battery 1318 via a solder connection (not shown). Thus, one or more of the shields 1312 operatively electrically couple the first circuit assembly 1306 to the second circuit assembly 1314. Specifically, in some embodiments, the battery 1318 transmits power to one or more of the electronic components of the first circuit assembly 1306 via the shields 1312.

In some embodiments, the circuit assemblies described above may detachably carry the batteries. In the case of the circuit assembly 1304, for example, the battery 1318 may be detachably carried by the shields 1312. The first or positive terminal 1350A of the battery 1318 may couple to a first conductive contact (not shown) carried by the first shield 1312A when the battery 1318 is carried by the shields 1312. The second or negative terminal 1350B of the battery 1318 may couple to a second conductive contact (not shown) carried by the second shield 1312B when the battery 1318 is carried by the shields 1312.

Figure 14:
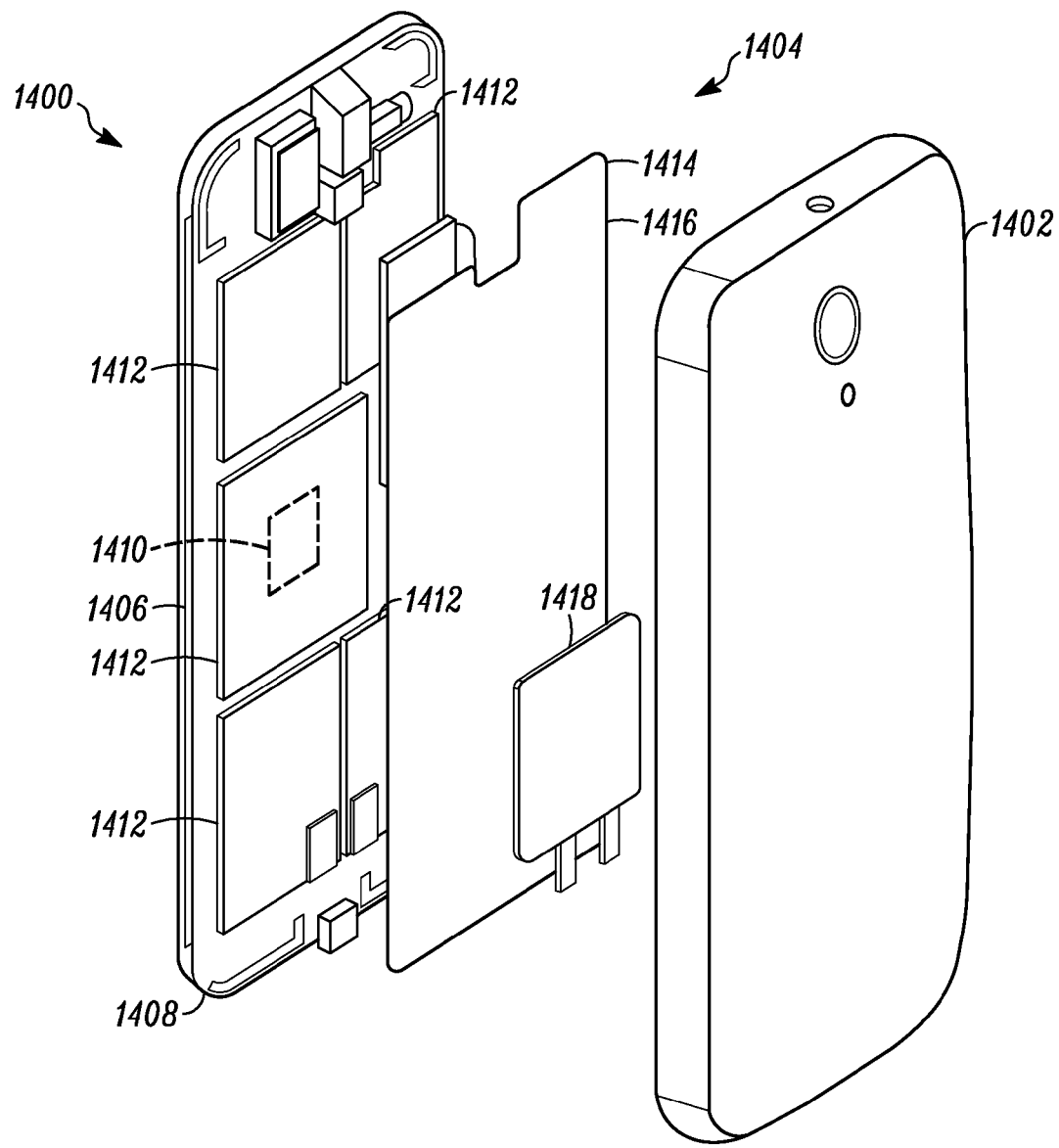
FIG. 14 is an exploded rear perspective view of an example electronic device.
Figure 15:
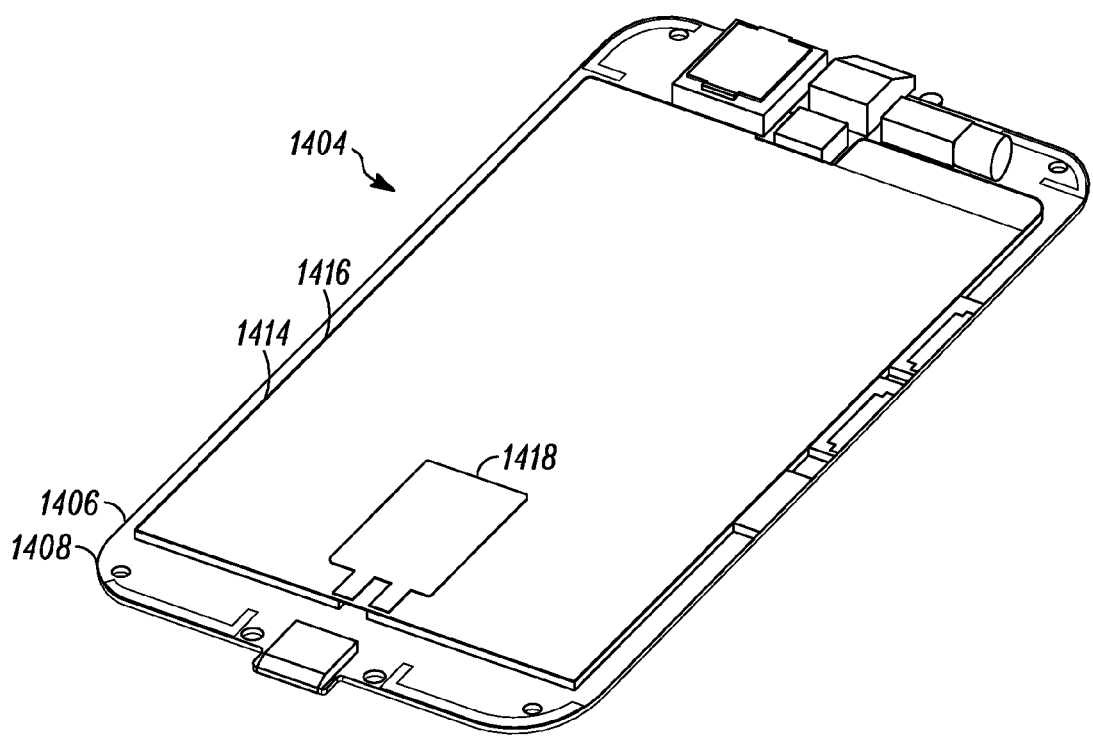
FIG. 15 is a rear perspective view of electronic circuitry of the electronic device of FIG. 14.

Another exemplary electronic device 1400 according to the present disclosure is illustrated in FIGS. 14 and 15. The electronic device 1400 is similar to the electronic device 100 described above. That is, the electronic device 1400 generally includes a device housing 1402 that carries electronic circuitry 1404. The electronic circuitry 1404 includes a first circuit assembly 1406 (for example, a first base or printed circuit board 1408 carrying one or more electronic components 1410, such as a processor, a memory device, a communication bus, a thermistor, a battery safety circuit, and the like). The device housing 1402 also carries one or more shields 1412 that are adapted to impede electromagnetic emissions therethrough. One or more of the shields 1412 operatively electrically couple the first circuit assembly 1406 to a second circuit assembly 1414 (for example, a second base or printed circuit board 1416 carrying one or more electronic components 1418). One or more of the electronic components 1410 of the first circuit assembly 1406 and one or more of the electronic components 1418 of the second circuit assembly 1414 may transmit electrical power and/or electrical communication/data signals to each other via the shields 1412.

In some embodiments, the electronic component 1418 carried by the second printed circuit board 1416 is a user identification and/or authentication component (for example, a subscriber identity module (SIM) "card"). In some embodiments, the electronic component 1418 carried by the second printed circuit board 1416 is a short range communication component (for example, an NFC transceiver for exchanging data with an NFC-enabled electronic device in relatively close proximity to, that is, within a few inches or less of, the electronic device). In some embodiments, the electronic component 1418 carried by the second printed circuit board 1416 is a wireless charging component (for example, a secondary coil of an inductive charging system in which an electrical current is induced by a primary coil in a separate charging device or "station" (not shown)). In some embodiments, the electronic component 1418 carried by the second printed circuit board 1416 is an illumination component (for example, a circuit that is operatively electrically coupled to a light or camera flash of the electronic device 1400). In some embodiments, the electronic component 1418 carried by the second printed circuit board 1416 is an electrostatic discharge grounding component. In some embodiments, the electronic component 1418 carried by the second printed circuit board 1416 is a user input component (for example, a circuit that is operatively electrically coupled to a power button or an audio volume button of the electronic device).

In some embodiments, different numbers of the shields 1412 may operatively electrically couple the first circuit assembly 1406 to the second circuit assembly 1414 depending on the type of electronic component 1418 that is carried by the second printed circuit board 1416. If the electronic component 1418 is a user identification and/or authentication component (such as a SIM card), for example, six shields 1412 may operatively electrically couple the first circuit assembly 1406 to the second circuit assembly 1414. If the electronic component 1418 is a wireless charging component (for example, a secondary coil of an inductive charging system), for example, two shields 1412 may operatively electrically couple the first circuit assembly 1406 to the second circuit assembly 1414.

Figure 16:
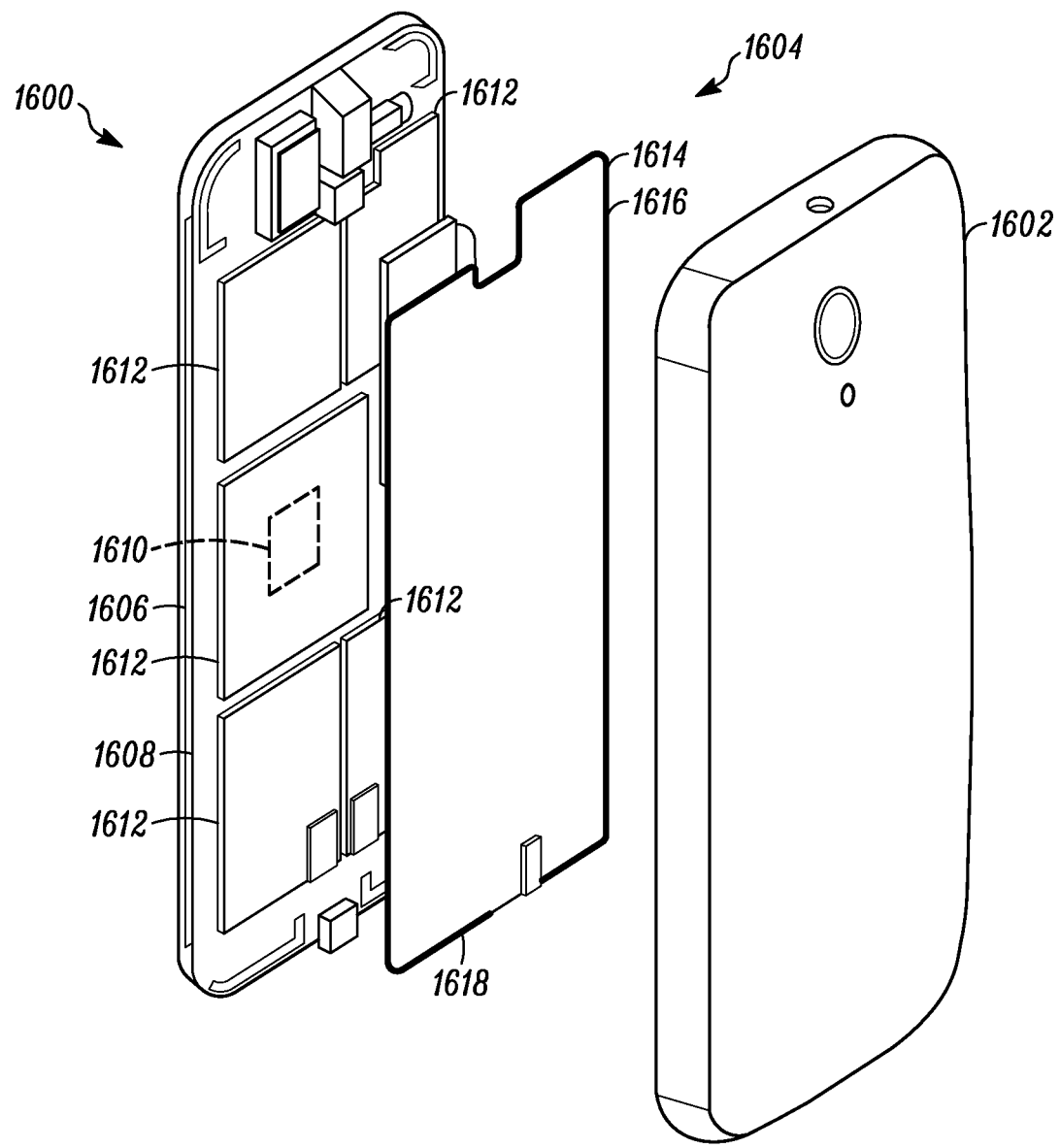
FIG. 16 is an exploded rear perspective view of an example electronic device.
Figure 17:
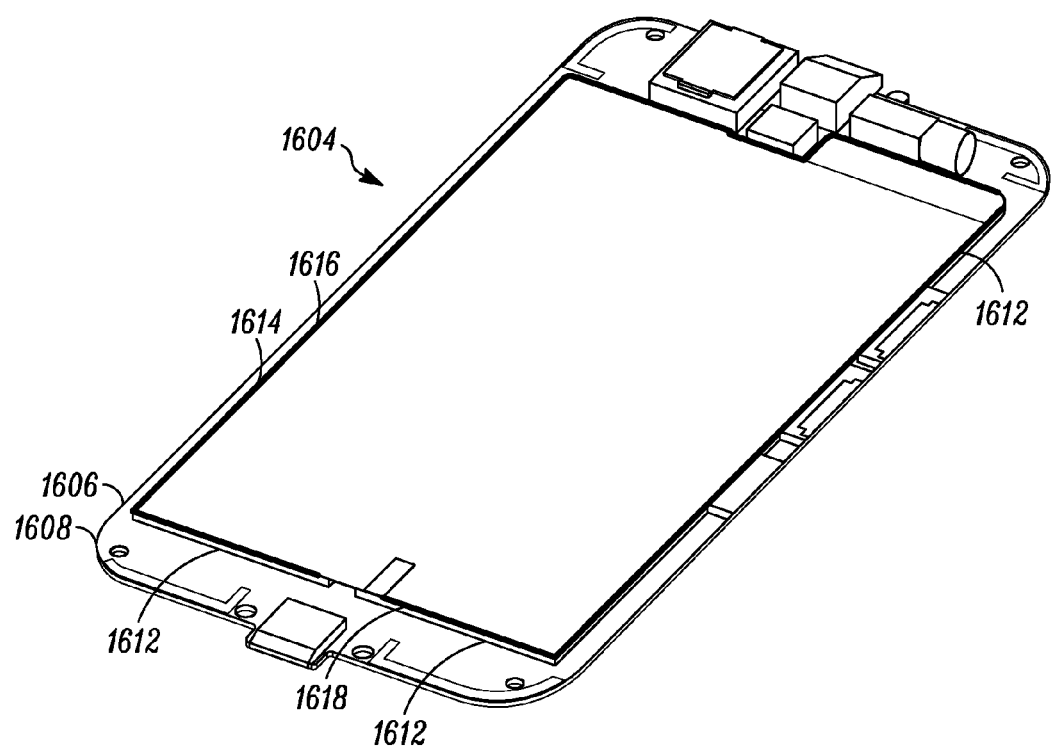
FIG. 17 is a rear perspective view of electronic circuitry of the electronic device of FIG. 16.

Another exemplary electronic device 1600 according to the present disclosure is illustrated in FIGS. 16 and 17. The electronic device 1600 is similar to the electronic devices 100 and 1400 described above. That is, the electronic device 1600 generally includes a device housing 1602 that carries electronic circuitry 1604. The electronic circuitry 1604 includes a first circuit assembly 1606 (for example, a first base or printed circuit board 1608 carrying one or more electronic components 1610, such as a processor, a memory device, a communication bus, a thermistor, a battery safety circuit, and the like). The device housing 1602 also carries one or more shields 1612 that are adapted to impede electromagnetic emissions therethrough. One of the shields 1612 operatively electrically couples the first circuit assembly 1606 to a second circuit assembly 1614 (for example, a second base or printed circuit board 1616 carrying an electronic component 1618). One or more of the electronic components 1610 of the first circuit assembly 1606 and the electronic component 1618 of the second circuit assembly 1614 may transmit electrical communication/data signals to each other via the shields 1612.

In some embodiments, the electronic component 1618 carried by the second printed circuit board 1616 is a radio component (for example, an FM radio antenna for receiving FM radio transmissions and transmitting them to other components of the electronic device 1600, such as the first circuit assembly 1606). In some embodiments, the radio component extends along at least a portion of the perimeter of the second printed circuit board 1616.

Figure 18:
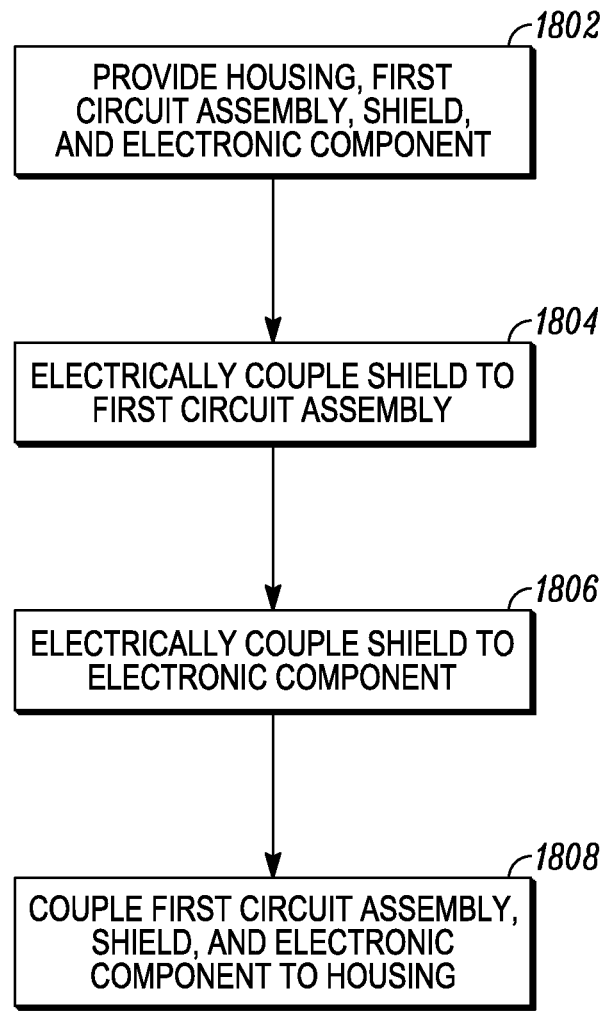
FIG. 18 is a flowchart of an example method for manufacturing an electronic device.

FIG. 18 illustrates a flowchart of an example method for manufacturing an electronic device according to the present disclosure. The following description of the method only refers to the electronic device 100, although it is to be understood that the same general description also applies to the other electronic devices described above, such as the electronic devices 1400 and 1600. The method begins at block 1802 by providing (that is, manufacturing or obtaining) the device housing 102, the first circuit assembly 306, an electronic component (for example, the battery 318), one or more of the shields 312, and the display 124. In some embodiments, the electronic component (for example, the battery 318) may be coupled to the second printed circuit board 316.

The method continues at block 1804 by electrically coupling one or more of the shields 312 to the first circuit assembly 306. In some embodiments, the shields 312 are secured and electrically coupled to the first circuit assembly 306 by soldering the shields 312 to the first printed circuit board 308 of the first circuit assembly 306.

The method continues at block 1806 by electrically coupling one or more of the shields 312 to the electronic component (for example, the battery 318) to operatively electrically couple the first circuit assembly 306 to the electronic component. In some embodiments, the shields 312 are secured and electrically coupled to the electronic component by soldering the shields 312 to the electronic component. In some embodiments, the shields 312 are secured and electrically coupled to the second circuit assembly 314 by soldering the shields 312 to the second printed circuit board 316.

In some embodiments, one or more of the shields 312 are secured to and electrically isolated from the electronic component. For example, one or more of the shields 312 may each be soldered to the electronic component apart from conductive terminals of the electronic component. As another example, one or more of the shields 312 may each be soldered to the second printed circuit board 316 apart from solder pads of the second printed circuit board 316.

The method concludes at block 1808 by coupling the first circuit assembly 306, the electronic component (for example, the battery 318), the shields 312, and the display 124 to the device housing 102 (for example, via fasteners and/or adhesives).

The foregoing description has been presented for the purposes of illustration and description. It is not intended to be exhaustive or to limit the disclosure to the exemplary embodiments described above. Many modifications and variations are possible in light of the above teachings. It is intended that the scope of this disclosure be limited not by this detailed description of examples, but rather by the claims appended hereto.

What is claimed is:

1. An electronic device, comprising:
   a device housing;
   a circuit assembly carried by the device housing;
   an electronic component carried by the device housing;
   a shield carried by the device housing, the shield being adapted to impede electromagnetic emissions, and the shield operatively electrically coupling the circuit assembly to the electronic component.

2. The electronic device of claim 1, wherein the electronic component is a first electronic component, the circuit assembly includes a base and a second electronic component carried by the base, and the shield includes a shield body that defines a shield chamber, the shield chamber housing the second electronic component.

3. The electronic device of claim 1, wherein the shield is a first shield, and further comprising a second shield carried by the device housing, the second shield being adapted to impede electromagnetic emissions.

4. The electronic device of claim 3, wherein the second shield operatively electrically couples the circuit assembly to the electronic component.

5. The electronic device of claim 1, wherein the electronic component is one of a battery, a short range communication component, a wireless charging component, an illumination component, a radio component, an electrostatic discharge grounding component, a user identification and/or authentication component, and a user input component.

6. An electronic device, comprising:
   a circuit assembly;
   a shield carried by the circuit assembly, the shield being adapted to impede electromagnetic emissions;
   an electronic component carried by the shield; and
   wherein the shield operatively electrically couples the circuit assembly to the electronic component.

7. The electronic device of claim 6, wherein the electronic component is a first electronic component, the circuit assembly includes a base and a second electronic component carried by the base, and the shield includes a shield body that defines a shield chamber, the shield chamber housing the second electronic component.

8. The electronic device of claim 6, further comprising a connection securing the shield to the circuit assembly and operatively electrically coupling the circuit assembly to the electronic component via the shield.

9. The electronic device of claim 8, wherein the connection is a solder connection.

10. The electronic device of claim 9, wherein the solder connection is a first solder connection, and further comprising a second solder connection securing the shield to the electronic component and operatively electrically coupling the circuit assembly to the electronic component via the shield.

11. The electronic device of claim 6, wherein the electronic component is a first electronic component, the circuit assembly includes a base, a second electronic component carried by the base, and a third electronic component carried by the base, and further comprising:
   a first connection electrically coupling the shield to the second electronic component; and
   a second connection electrically coupling the shield to the third electronic component.

12. The electronic device of claim 11, wherein the first connection and the second connection are solder connections.

13. The electronic device of claim 11, wherein the electronic component is a battery, and wherein the battery transmits power to the second electronic component via the shield and the first connection, and the battery transmits power to the third electronic component via the shield and the second connection.

14. The electronic device of claim 6, wherein the shield is interposed between the circuit assembly and the electronic component.

15. The electronic device of claim 14, wherein the circuit assembly is a first circuit assembly, further comprising a second circuit assembly including a base carrying the electronic component, and the shield operatively electrically couples the first circuit assembly to the electronic component via the base.

16. The electronic device of claim 15, wherein the shield is interposed between the first circuit assembly and the second circuit assembly.

17. The electronic device of claim 14, wherein the circuit assembly is a first circuit assembly and the shield is a first shield, and further comprising:
   a second circuit assembly including a base carrying the electronic component; and
   a second shield carried by the first circuit assembly, the second shield being adapted to impede electromagnetic emissions;
   wherein the first shield and the second shield operatively electrically couple the first circuit assembly to the electronic component via the base.

18. The electronic device of claim 17, wherein the electronic component is a battery including a positive terminal and a negative terminal, and the first shield operatively electrically couples the positive terminal to the first circuit assembly and the second shield operatively electrically couples the negative terminal to the first circuit assembly.

19. The electronic device of claim 6, wherein the shield is a first shield, and further comprising a second shield carried by the circuit assembly, the second shield operatively electrically coupling the circuit assembly to the electronic component.

20. A method for manufacturing an electronic device, comprising:
providing a device housing, a circuit assembly, an electronic component, and a shield adapted to impede electromagnetic emissions;
electrically coupling the shield to the circuit assembly;
electrically coupling the shield to the electronic component to operatively electrically couple the circuit assembly to the electronic component; and
coupling the circuit assembly, the electronic component, and the shield to the device housing.

21. The method of claim 20, wherein the circuit assembly is a first circuit assembly, further comprising providing a second circuit assembly including a base carrying the electronic component, and wherein electrically coupling the shield to the electronic component includes electrically coupling the shield to the base.

22. The method of claim 21, wherein electrically coupling the shield to the first circuit assembly includes soldering the shield to the first circuit assembly, and wherein electrically coupling the shield to the base includes soldering the shield to the base.

* * * * *

UNITED STATES PATENT AND TRADEMARK OFFICE
CERTIFICATE OF CORRECTION

| | | |
|---|---|---|
| PATENT NO. | : 9,192,084 B2 | Page 1 of 1 |
| APPLICATION NO. | : 14/136118 | |
| DATED | : November 17, 2015 | |
| INVENTOR(S) | : Roger W. Ady et al. | |

It is certified that error appears in the above-identified patent and that said Letters Patent is hereby corrected as shown below:

On the title page item (72), line 1,

The first inventor's name should read as follows:

Roger W. Ady

Signed and Sealed this
Sixteenth Day of February, 2016

Michelle K. Lee
*Director of the United States Patent and Trademark Office*

UNITED STATES PATENT AND TRADEMARK OFFICE
CERTIFICATE OF CORRECTION

PATENT NO.         : 9,192,084 B2
APPLICATION NO.    : 14/136118
DATED              : November 17, 2015
INVENTOR(S)        : Ady et al.

Page 1 of 1

It is certified that error appears in the above-identified patent and that said Letters Patent is hereby corrected as shown below:

On the title page item (12), should read as follows:

Ady et al.

On the title page item (72), line 1,

The first inventor's name should read as follows:

Roger W. Ady

This certificate supersedes the Certificate of Correction issued February 16, 2016.

Signed and Sealed this
Seventh Day of June, 2016

Michelle K. Lee
*Director of the United States Patent and Trademark Office*